United States Patent
Günther et al.

(10) Patent No.: US 10,557,196 B2
(45) Date of Patent: Feb. 11, 2020

(54) METHOD FOR REDUCING THE ADHESION OF DIRT TO A SUBSTRATE

(71) Applicant: Fraunhofer-Gesellschaft zur Förderung der angewandten Forschung e.V., Munich (DE)

(72) Inventors: Steffen Günther, Dresden (DE); Cindy Steiner, Dresden (DE); Jörg Kubusch, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 5 days.

(21) Appl. No.: 15/508,905

(22) PCT Filed: Sep. 10, 2015

(86) PCT No.: PCT/EP2015/070695
§ 371 (c)(1),
(2) Date: Mar. 3, 2017

(87) PCT Pub. No.: WO2016/038132
PCT Pub. Date: Mar. 17, 2016

(65) Prior Publication Data
US 2017/0218504 A1    Aug. 3, 2017

(30) Foreign Application Priority Data
Sep. 11, 2014 (DE) .......... 10 2014 113 097

(51) Int. Cl.
*C23C 14/00* (2006.01)
*C23C 14/04* (2006.01)
(Continued)

(52) U.S. Cl.
CPC ...... *C23C 14/5873* (2013.01); *C23C 14/0036* (2013.01); *C23C 14/04* (2013.01);
(Continued)

(58) Field of Classification Search
CPC ....... C23C 14/04; C23C 14/35; C23C 14/562; C23C 14/5873; C23C 14/0036;
(Continued)

(56) References Cited

U.S. PATENT DOCUMENTS

| 4,340,276 A | * | 7/1982 | Maffitt | B29D 11/00 |
|---|---|---|---|---|
| | | | | 204/192.27 |
| 6,555,430 B1 | | 4/2003 | Chudzik et al. | |

(Continued)

FOREIGN PATENT DOCUMENTS

| DE | 101 34 362 A1 | 7/2001 |
|---|---|---|
| DE | 101 38 036 A1 | 8/2001 |

(Continued)

OTHER PUBLICATIONS

Machine Translation JP 58118293 A (Year: 1988).*
(Continued)

*Primary Examiner* — Michael A Band
(74) *Attorney, Agent, or Firm* — Brinks Gilson & Lione

(57) ABSTRACT

A method for reducing the adhesion of dirt to a substrate is provided, where a thin, incompletely closed layer of a material is deposited on at least one surface area of the substrate by means of a vacuum deposition process, and then said surface area is acted upon by accelerated ions.

6 Claims, 1 Drawing Sheet

(51) Int. Cl.
    *C23C 14/08*     (2006.01)
    *C23C 14/10*     (2006.01)
    *C23C 14/35*     (2006.01)
    *C23C 14/56*     (2006.01)
    *C23C 14/58*     (2006.01)
    *C23C 16/455*    (2006.01)
    *H01J 37/32*     (2006.01)

(52) U.S. Cl.
    CPC .......... *C23C 14/083* (2013.01); *C23C 14/086* (2013.01); *C23C 14/10* (2013.01); *C23C 14/35* (2013.01); *C23C 14/562* (2013.01); *C23C 16/45525* (2013.01); *H01J 37/32* (2013.01)

(58) Field of Classification Search
    CPC . C23C 14/086; C23C 14/06; C23C 16/45525; C23C 14/042; C23C 14/5826; C23C 14/5833; C23C 14/083; C23C 14/10; H01J 37/32
    USPC ................ 428/172, 627; 204/298.16, 192.22
    See application file for complete search history.

(56) References Cited

U.S. PATENT DOCUMENTS

| | | | |
|---|---|---|---|
| 2007/0184257 A1* | 8/2007 | Glocker | A61F 2/30767 428/304.4 |
| 2010/0098909 A1 | 4/2010 | Reyssat et al. | |
| 2011/0229667 A1 | 9/2011 | Jin et al. | |

FOREIGN PATENT DOCUMENTS

| | | | |
|---|---|---|---|
| DE | 10 2005 049280 A1 | 6/2007 | |
| EP | 1 238 717 A2 | 1/2002 | |
| JP | 58118293 A * | 7/1983 | ............ G11B 7/241 |
| JP | 63270452 A * | 11/1988 | |
| JP | 2009-128543 | 6/2009 | |
| KR | 10-2012-0033805 | 4/2012 | |
| WO | WO 2006/021507 A1 | 3/2006 | |

OTHER PUBLICATIONS https://en.wikipedia.org/wiki/Plasma_polymerization [Accessed on Jul. 16, 2018].*

Grigoras et al., "Application of ultra-thin aluminum oxide etch mask made by atomic layer deposition technique," dated 2006, pp. 1-5, Journal of Physics: Conference Series 61 (2007).

Kleinke et al., "A New Type of PTFE-Covered Gas Evolving Electrode," dated Sep. 1986, pp. 1-4, J. Electrochem. Soc.: Electrochemical Science and Technology.

Research and Innovative Solutions, "Definitions for Hydrophilicity, Hydrophobicity, and Superhydrophobicity: Getting the Basics Right," The Journal of Physical Chemistry Letters, dated Feb. 20, 2014, pp. 686-688, vol. 5, Issue 4, published online by American Chemical Society at URL https://pubs.acs.org/doi/pdf/10.1021/jz402762h?rand=tt28rgbn.

Anonymous, "Lotus Effect," Wikipedia, dated Jul. 16, 2019, pp. 1-5, published online by Wikipedia at URL https://en.wikipedia.org/wiki/Lotus_effect.

* cited by examiner

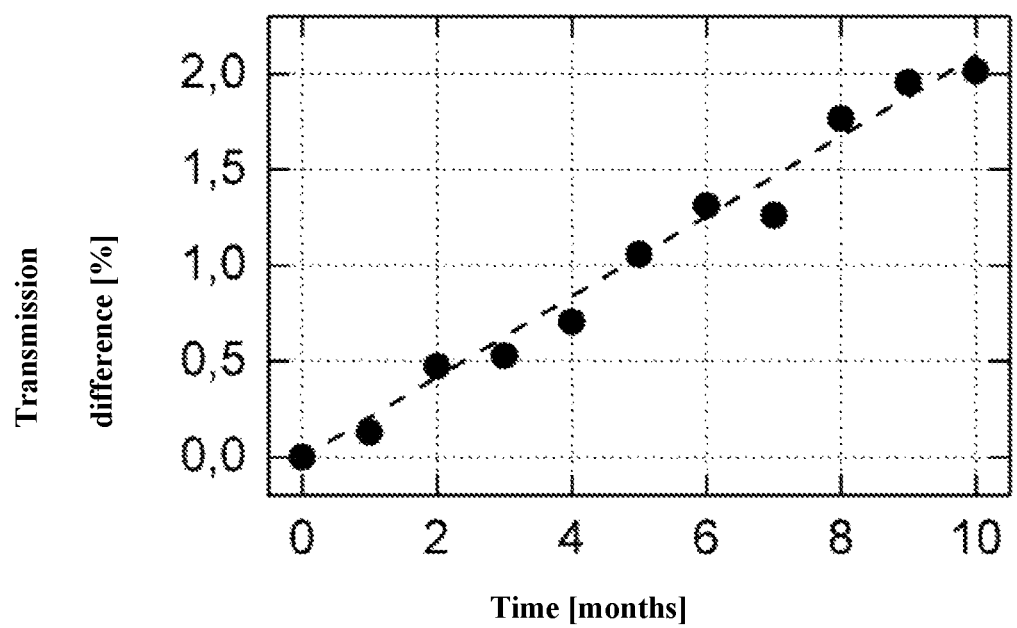

METHOD FOR REDUCING THE ADHESION OF DIRT TO A SUBSTRATE

CROSS-REFERENCE TO RELATED APPLICATIONS

This application is a 371 nationalization of PCT/EP/2015/070695, entitled "METHOD FOR REDUCING THE ADHERENCE OF DIRT TO A SUBSTANCE", having an international filing date of Sep. 10, 2015, which in turn claims priority under 35 USC § 119 to German patent application 10 2014 11 3 097.9 filed on Sep. 11, 2014, which are hereby incorporated by reference.

BRIEF DESCRIPTION OF THE DRAWINGS

FIG. 1 is a graph illustrating the difference between the optical transmission of a sample treated according to the invention and the optical transmission of the untreated sample.

DETAILED DESCRIPTION

The invention relates to a method for reducing the adhesion of dirt to a substrate and, in particular, to substrates having a plastic surface.

Surfaces have the tendency to become dirty, in particular, in an exposed environment. Such fouling can vary in nature, but any form of fouling degrades the properties of surfaces. In addition, as soon as the surfaces are a part of bodies that have optical functions, the effect of the fouling on these surfaces is, for example, a reduction in the optical transmission of the light through this body. One example of such a phenomenon would be the front panels of solar modules. In order to maintain the efficiency of such modules for a number of years, comprehensive and expensive measures for cleaning the surfaces are necessary. Only in this way is it possible to guarantee that the fouling that occurs on the solar modules will not have a significant effect on the energy yield. The drawbacks with such measures are not only the general costs associated with such cleaning, but also that the cleaning is not done as required, but rather after specified periods of time. As a result, the fouling can reduce the efficiency of such solar modules until the next cleaning takes place.

It is more economical to design a surface in such a way that it is less inclined to become dirty. It is known to design surfaces with properties that achieve an effect based on the Lotus effect. Such a surface is often produced by complicated structuring measures, as described, for example, in the German patent DE 101 34 362 A1. In this case an elaborate manufacturing process is used to produce structures, which are geometrically strictly defined by a molding process, in a material that has been applied in addition. Correspondingly the transfer of such structures to large areas is complicated. The transfer of structures to an additively applied material is also described in DE 101 38 036 A1.

Another method of applying an additive material, followed by subsequent embossing of a structure, is known from the European patent EP 1 238 717 A2. In this case, shapes are formed, as a structure, on the basis of a mathematical function, a method that requires a sophisticated process control. Furthermore, the international patent application publication WO 2006/021507 A1 also discloses a structured surface that is built up by means of an electrochemical deposition process.

All of the aforementioned methods have in common that an additive material has to be applied to the original surface. In practice, the bonding of the additive material to the surface always constitutes a weak point, since layers that are applied in this way tend to peel. Furthermore, all of the known methods have in common that the structuring is carried out by means of very complex methods in order to achieve the aforementioned Lotus effect.

Therefore, the present invention is based on the technical problem of providing a method, by means of which the disadvantages associated with the prior art are overcome. In particular, a structure on the surface of a substrate that reduces the adhesion of dirt to the substrate can be created with the inventive method. At the same time, the method can be performed with less engineering effort than that required by the prior art.

The solution to this technical problem is solved by the subject matters exhibiting the features disclosed in patent claim 1. Other advantageous embodiments of the invention will become apparent from the dependent claims.

In the inventive method for reducing the adhesion of dirt to a substrate, a thin, incompletely closed layer of a material is initially deposited on at least one surface area of the substrate by means of a vacuum coating process in a first process step. The term "a thin, incompletely closed layer" is defined in the context of the invention to mean that the layer thickness is less than 100 nanometers and that the surface area has, after the coating process, not only a plurality of subareas, on which the layer material is deposited, but also a plurality of subareas, on which the coating material is not deposited. An incompletely closed layer can be produced, for example, by arranging a mask over the substrate, so that only isolated subareas on the substrate are covered with a layer material during a coating process. According to the invention, however, an incompletely closed layer is deposited preferably without a mask by selecting such a low coating rate during a coating process that the entire surface of the substrate is no longer coated with the layer material, but rather only individual subareas of the substrate surface are covered with islands of layer material. The adjustment required to set such a low coating rate is a function of the coating process that is used in each case and can be determined by laboratory tests. Owing to the deposition of the thin, incompletely closed layer the surface on the substrate already exhibits a first roughness that is conducive to the Lotus effect, as a result of which the adhesion of the dirt to the substrate is reduced.

Vacuum coating processes that have a low deposition rate are particularly suitable for the deposition of such a thin, incompletely closed layer on a substrate. In this case the vacuum coating process can also be operated in the reactive mode. If the substrate is coated by means of a dynamic deposition process, i.e., in the case of a moving substrate, then vacuum coating processes at a deposition rate of up to 30 nm m/min are suitable. Preferably the thin, incompletely closed layer is deposited by magnetron sputtering. In the case of magnetron sputtering, the deposition rate can be chosen almost infinitely small. As a result, the deposition rate can be set only so low that it is also possible to achieve with the deposited material a surface coverage on the surface area that is not even sufficient to form a single completely closed atomic layer or molecular layer of the deposited material. In any event this procedure ensures that a thin, incompletely closed layer is formed on the surface area of the substrate. Since in the case of the inventive deposition of the thin, non-closed layer only the resulting surface roughness is in the foreground, the material of the deposited layer plays only a subordinate role. If the thin, non-closed layer is deposited by magnetron sputtering, then it is also possible to use any material that can be deposited by magnetron sputtering on the substrate. Hence, for example, incompletely closed layers were deposited by magnetron sputtering in laboratory tests, where in this case the thin, incompletely closed layers contained at least one of the elements selected from the group comprising silicon, zinc, titanium, tin or aluminum, and all of them were suitable for the inventive method. Preferably, the aforementioned chemical elements are deposited in a reactive process in the presence of an oxygen-containing gas as the oxide. In such a reactive deposition process it is easier to form an incompletely closed layer than in a metal deposition process, because the existing oxygen leads to the formation of oxides on the target surface, a state that reduces the rate of deposition.

As an alternative, other vacuum processes and other layer materials, such as, for example, processes and layer materials that are known from the atomic layer deposition process, can be used for the deposition of the thin, incompletely closed layer. Such deposition processes are also referred to as atomic layer deposition, or ALD in the abbreviated form. If the feed rate of the substrate is set sufficiently high in the dynamic coating process of a substrate by the ALD technique, then a thin, incompletely closed layer can also be formed by the ALD technique. In this case, too, the feed rate that is required to form an incompletely closed layer can be easily determined in laboratory tests.

Once the thin, incompletely closed layer is deposited on the surface area of the substrate, then at least this surface area is acted upon by accelerated ions in a second process step; and, in so doing, an ion etching process is carried out, so that in the end, the surface area is provided with a roughness, where the Lotus effect can come into play. For this process step, it is possible to use, for example, the ions of a plasma that are generated by a sputtering magnetron. This feature is particularly advantageous, if the thin, incompletely closed layer is already deposited by magnetron sputtering, because then the same industrial systems and at least similar pressure levels in the process chamber can be used for both steps. However, any other process that is known for ion etching is also suitable for the second process step.

Performing the ion etching process by means of a magnetron plasma lends itself particularly well to reducing the adhesion of dirt to plastic substrates or, more specifically, to substrates that have at least one top layer made of a synthetic plastic material. It is assumed that the energy of the accelerated ions from a magnetron plasma correlates, in particular, with the bonding energy of the molecules of a synthetic plastic material, i.e., that the energy of the accelerated ions, directed onto the substrate, is so great that it can knock particles off of the surface, said particles being of a size that when they are dislodged, the result is a roughness that is conducive to the Lotus effect. However, it was also possible to show for metal surfaces a decrease in the adhesion of dirt by means of the inventive method, in which the ion etching was carried out by means of a magnetron plasma.

Compared to the prior art, the inventive method is characterized by a number of advantages. First of all, the inventive method is very economical, because only a very thin and incompletely closed layer is deposited, so that only a small amount of layer material is required. Furthermore, the inventive method can also make do without a complex masking step in order to form from a top layer the surface structure required for the Lotus effect. Such a masking step is already inherent in the process of the invention.

Since a small amount of the material is sprinkled very thinly on the surface area of the substrate in order to deposit a thin, incompletely closed layer, the result is that a plurality of material islands of different sizes and with a stochastic distribution pattern are formed on the surface area of the substrate, so that this phenomenon already leads to a first masking of the substrate surface. During ion etching, the ions remain adhered to these islands of material. The larger an island of material is, the higher the number of adhering ions and the greater also the repelling effect that such an island of material exerts on the ions, which are accelerated in the direction of the substrate surface, in the next phase of the etching process due to the adhering ions. That is, individual subareas on the surface of the substrate are affected to a varying degree by the ion etching, a feature that in turn has a positive effect on the surface roughness that can be achieved. Thus, in the ion etching process the inventive method is also characterized by a kind of self-organizing masking, for which no additional effort has to be expended.

The present invention is explained in greater detail below by means of one exemplary embodiment. The materials that are used for the substrate and the layer in this case as well as the system and process parameters that are employed are given only by way of example and do not limit the scope of protection of the invention. In a film treatment plant, a web-shaped substrate, formed as a fluoropolymer ETFE, was treated in a dynamic inventive process for producing a dirt-repellent surface. In this case the ETFE substrate may be covered at a line speed of 1.3 m/min. While the ETFE substrate was being covered, the ETFE was guided past two processing stations positioned one behind the other. Each of these processing stations comprises a double magnetron system, which is typically used for layer deposition by means of cathode sputtering. Each of the two processing stations was operated with a bipolar pulsed voltage, where the pulse frequency was 50 kHz. The power, fed into the processing stations, was 4 kW for the first and 8 kW for the second station. In the first station, the double magnetron was equipped with targets, which were made of a zinc-tin alloy. The second station had magnesium targets. Owing to the intake of oxygen into the processing chamber, both processing stations were operated in the reactive mode. The first station had the first process step of producing a very thin and incompletely closed layer on the plastic substrate. To this end, it was exploited that the supplied reactive gas—oxygen—causes the magnetron targets to oxidize, so that the rate of deposition on the ETFE decreased as compared to a coating without oxygen. Previously laboratory tests had been conducted to determine the inflow amount of oxygen, at which the target material that was used and that was made of a zinc-tin alloy ensures in the reactive mode a very low, yet still present coating rate, at which a plurality of island-like accumulations of material are deposited on the substrate; and, as a result, an incompletely closed layer is formed on the substrate. Due to the fact that in passing through the first station an incompletely closed layer was formed, an increase in roughness on the surface of the ETFE substrate could already be achieved, a feature that is important for the formation of the Lotus effect. Furthermore, the thin sprinkling of the layer material in the first double magnetron station and the resulting deposition of a thin, incompletely closed layer made it already possible to achieve a first masking of the surface of the ETFE substrate.

In contrast, the magnesium target material of the second station has no appreciable coating rate in the fully reactive mode. However, in this case it is the oxygen ions that are generated in the magnetron plasma and that attack and degrade the polymer material. It goes without saying that this takes place, in particular, on the surface subareas of the plastic substrate, on which the material, applied with the first station, is not present. In addition, during the ion bombardment, an additional masking of the substrate takes place, this additional masking being self-organized due to the above described ion effects on the incompletely closed layer. Thus, the oxygen plasma etches to a varying degree the surface of the plastic substrate in a locally limited manner and, in this way, produces a nanostructure that is conducive to the Lotus effect.

However, the roll of the ETFE substrate was not completely treated with the method according to the invention. One end of the web-shaped ETFE substrate remained untreated. After treating the roll according to the invention, a first sample was cut out of the area that had been treated according to the invention; and a second sample was cut out of the untreated area. Then both cut samples were subjected to weathering in the open air for several months. The fouling of the samples was examined at regular intervals. For this purpose the optical transmission of the samples was used to determine the fouling. Fouling of the surfaces should lower the transmission of the samples. Therefore, a comparison of the respective changes in transmission and the associated output value allows a qualitative statement to be made about the fouling of a sample.

Over a period of several months the optical transmission of the samples was determined at various points in time. Surprisingly differences were found in the transmission changes over the course of time when the sample, treated according to the invention, was compared with the untreated sample. In addition to the weathering period, the comparison showed that the optical transmission of the treated sample did not decrease as significantly as the optical transmission of the untreated sample and, as a result, showed that the treated sample did not get as dirty as the untreated sample. FIG. 1 shows the difference between the optical transmission of the sample, treated according to the invention, and the optical transmission of the untreated sample as a graph. It can be seen in FIG. 1 that the difference between the two samples increases continuously over time in terms of the optical transmission. The smaller transmission loss of the sample, treated according to the invention, as compared to the untreated sample suggests that the sample, treated according to the invention, is less dirty than the untreated sample in the period of time under consideration.

Therefore, the inventive method can be applied particularly advantageously to components having an optical functional or to decorative components, where it has the effect of lowering the expense of the routine cleaning and correspondingly increasing the efficiency.

The invention claimed is:

1. A method for reducing the adhesion of dirt to a substrate, the method comprising:
   depositing a thin, incompletely closed layer of a material on at least one surface area of the substrate by a reactive vacuum coating process, the incompletely closed layer of the material comprising a plurality of islands of the material on the substrate, wherein the thin, incompletely closed layer is deposited by a sputtering magnetron, and wherein an oxygen-containing gas is used as a reactive gas in the reactive vacuum coating process; and
   ion etching the at least one surface area after the thin, incompletely closed layer is deposited, wherein during the ion etching, ions adhere to the islands of the material, and surface subareas of the substrate on which the material is not present are affected to a varying degree by the ion etching, and wherein the ion etching results in a surface structure required for a Lotus effect, wherein the substrate includes an optical component, wherein optical transmission of light through the substrate is affected by an amount of dirt on the surface structure, and wherein ions causing the ion etching come from a plasma that is generated by the sputtering magnetron.

2. The method of claim 1, wherein the material, which contains at least one of the elements zinc, tin, silicon, titanium, or aluminum, is selected as a magnetron target.

3. The method of claim 1, wherein a plastic substrate or a substrate having a plastic top layer is used as the substrate.

4. The method of claim 1, wherein the material is deposited at an amount on the at least one surface area of the substrate that is not sufficient to completely cover the at least one surface area with an atomic layer of the material.

5. The method of claim 1, wherein the optical component is a front panel of solar modules.

6. The method of claim 1, wherein the substrate comprises a roll of fluoropolymer Ethylene tetrafluoroethylene.

* * * * *